(12) United States Patent
Persson

(10) Patent No.: US 8,184,830 B1
(45) Date of Patent: May 22, 2012

(54) AUDIO AMPLIFIER WITH SIMPLIFIED ELECTRICAL ISOLATION

(75) Inventor: Eric Persson, Minnetonka, MN (US)

(73) Assignee: International Rectifier Corporation, El Sugundo, CA (US)

( * ) Notice: Subject to any disclaimer, the term of this patent is extended or adjusted under 35 U.S.C. 154(b) by 2664 days.

(21) Appl. No.: 10/807,994

(22) Filed: Mar. 24, 2004

Related U.S. Application Data

(60) Provisional application No. 60/457,819, filed on Mar. 24, 2003.

(51) Int. Cl.
*H03F 99/00* (2009.01)
*H04R 5/00* (2006.01)
*H03G 11/00* (2006.01)
(52) U.S. Cl. .............. 381/120; 381/28; 381/55
(58) Field of Classification Search .......... 381/120, 381/323, 58, 55, 28; 330/251, 207 A
See application file for complete search history.

(56) References Cited

U.S. PATENT DOCUMENTS 4,066,973 A * 1/1978 McNally .............. 330/10
5,164,991 A * 11/1992 Johnson et al. .......... 381/120

* cited by examiner

*Primary Examiner* — Vivian Chin
*Assistant Examiner* — Douglas Suthers
(74) *Attorney, Agent, or Firm* — Farjami & Farjami LLP

(57) ABSTRACT

A power amplifier that can provide electrical isolation between an input signal and an amplified output signal avoids isolation between the amplifier output and the load to reduce complexity, component count, cost and size over prior power amplifiers. The power amplifier avoids the use of a power transformer to provide electrical isolation, while maintaining electrical isolation between the amplifier and the input signal to satisfy regulatory requirements. A power converter in the amplifier may be directly connected to input power lines, and provide power factor correction and voltage bus regulation to supply appropriate power to the amplifier. The input signal may be electrically isolated from the amplifier through any suitable isolation including optical isolation or magnetic isolation.

14 Claims, 3 Drawing Sheets

AUDIO AMPLIFIER WITH SIMPLIFIED ELECTRICAL ISOLATION

RELATED APPLICATION

This application is based on and claims benefit of U.S. Provisional Application No. 60/457,819, filed on Mar. 24, 2003, entitled Audio Amplifier With Simplified Electrical Isolation, to which a claim of priority is hereby made.

BACKGROUND OF THE INVENTION

1. Field of the Invention

The present invention relates generally to audio amplifiers, and relates more particularly to powered or active amplifier speaker combinations with electrical isolation features.

2. Description of Related Art

Powered speakers essentially have a power amplifier suitably mounted to the speaker cabinet for driving the speakers. The power amplifier is matched to the capability of the speakers, or transducers, as a group, and a conventional passive crossover system is used between the various transducers. That is, the transducers are coupled to the amplifier output with individualized compensation components that are passive. Typically, the input is an earth ground-referenced, low signal-level input. The input line power includes an earth ground reference and the amplifier output connections are not user-accessible. The input line power is typically a utility voltage input for powering the amplifier.

Active speakers are different from powered speakers in that each transducer, for example, low, mid, and high frequency speakers, has its own amplifier specifically matched to it to optimize individual transducer performance. In addition, an optimized electronic crossover splits the audio signal more accurately, e.g., through active filters, and with less distortion than conventional passive crossovers. Moreover, the electronic crossover can include phase-delay correction to properly time-align the transducers, thus eliminating the need to have all the transducers physically aligned in the speaker cabinet. The phase delay correction permits construction of more compact cabinets without compromising performance. Like powered speakers, active speakers have a utility power input, isolated audio inputs, and the amplifier outputs are not user accessible.

In a conventional audio system with separate amplifiers and passive speaker components, the inputs and outputs of the amplifier are isolated from the line input connection to comply with electrical safety regulations. This means that the "common" or ground terminals are at earth ground, and there is no galvanic connection between any user-accessible connection and the line input. These conventions are maintained for both signal input and speaker output connections, when both are user accessible.

Since power amplifiers typically have one or more DC busses internally, galvanic isolation is conventionally provided in the power supply section for ease of design. Designs using conventional linear power supplies typically have line-frequency transformers that provide isolation. Higher-powered amplifiers use switching power supplies with isolation provided in the high-frequency transformer. Switching power supplies, however, can generate significant electrical noise (EMI), and are therefore not commonly used, except in the highest power professional audio amps.

Many powered and active speakers today use relatively conventional power supply topologies, so that the input and output of the amplifier are isolated. The use of conventional power supplies adds extra expense and weight, especially in the case of linear transformers. The linear transformers typically have a greater VA rating than the total output power of the amplifier(s). Moreover, most amplifiers use tape-wound toroidal power transformers because they emit far less leakage magnetic field than standard transformers, and therefore induce less "hum" into the system. However, the toroidal transformer construction is more expensive than conventional bobbin-wound transformers, and therefore adds cost to the system.

SUMMARY OF THE INVENTION

According to the present invention, there is a provided a non-isolated power supply for an amplifier with reduced rating requirements to decrease the size, weight and cost of the amplifier system. A separate signal input is maintained with isolation from the power supply and amplifier to comply with regulatory requirements. Isolation of the input audio signal from the power stage permits the incorporation of a number of manipulation techniques, including digital filtering, optical or magnetic transmitters, and the like.

The connection in the power or active speaker system between the speaker and the amplifier is not user accessible, and therefore need not be galvanically isolated from the line input power. Accordingly, by providing isolation for the audio signal input, the amplifier and transducer according to the present invention meets regulatory requirements while reducing size, weight and cost. According to a feature of the present invention, the signal input can be amplified or filtered using power from the power line input with an isolated bias supply. The low level signal voltage involved with pre-amplifying or filtering the audio signal input does not require large power converters to achieve a desired amplified or filtered signal. Accordingly, the present invention can be realized to dramatically reduce the size, weight and cost of a powered or active speaker system.

According to an advantage of the present invention, the audio input signal can be digitally filtered or manipulated for the particular amplifier and speaker combination. In addition, the amplifier can be made to be a digital amplifier to potentially increase the sensitivity and quality of the audio output. The digital power amplifier can be matched to the characteristics of the attached transducer, to achieve higher performance with less components and cost.

In accordance with another advantage of the present invention, the replacement of the transformer of the amplifier power supply with a rectifier and filter combination produces better control over the input power to increase the power factor of the amplifier while providing a highly regulated DC bus particularly suited for the application.

Other features and advantages of the present invention will become apparent from the following description of the invention which refers to the accompanying drawings.

DETAILED DESCRIPTION OF THE PREFERRED EMBODIMENTS

Figure 1:
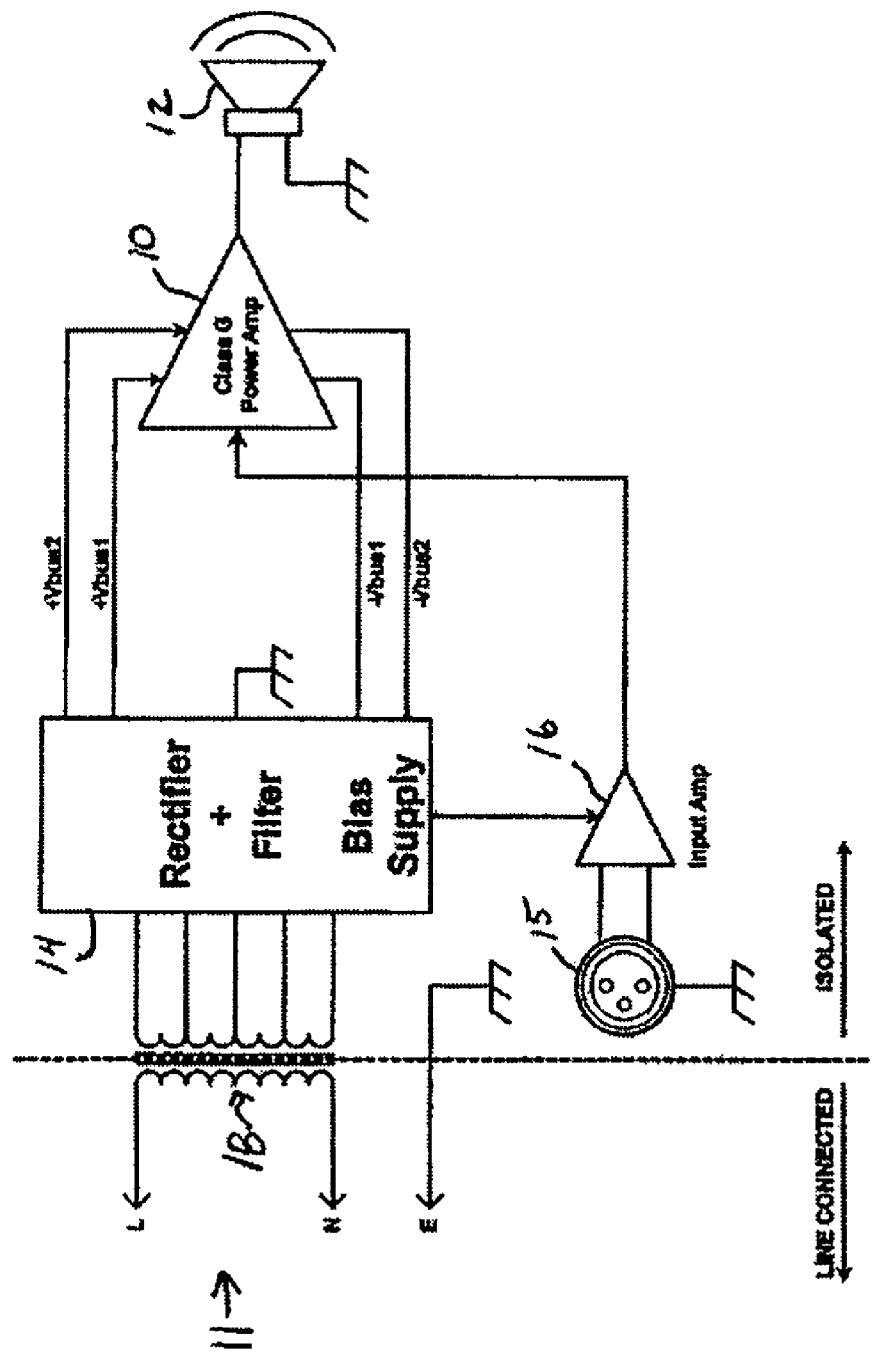
FIG. 1 is a diagram of a conventional class G amplifier and speaker system isolated with a transformer.

Referring to FIG. 1, a conventional class G linear amplifier 10 is illustrated driving a speaker or transducer 12. A power supply 14 provides filtered and rectified DC power to amplifier 10, as well as a bias supply to input amplifier 16. Power supply 14 is driven by a linear transformer 18 with multiple secondary windings to provide electrical isolation between an output of amplifier 10 and a line input 11, designated as L and N on the primary side of transformer 18. Transformer 18 supplies the electrical isolation required when an audio input 15 is accessible to a user, or if the output of amplifier 10 is user accessible.

In addition, transformer 18 is a linear transformer for use with a conventional power supply 14, meaning that transformer 18 has a greater VA rating than the total output power of the amplifier(s). If the speaker system illustrated in FIG. 1 is a powered or active speaker system, a connection between amplifier 10 and speaker 12 is not user accessible. Accordingly, the output of amplifier 10 need not be isolated from line input power to comply with regulatory requirements.

Figure 2:
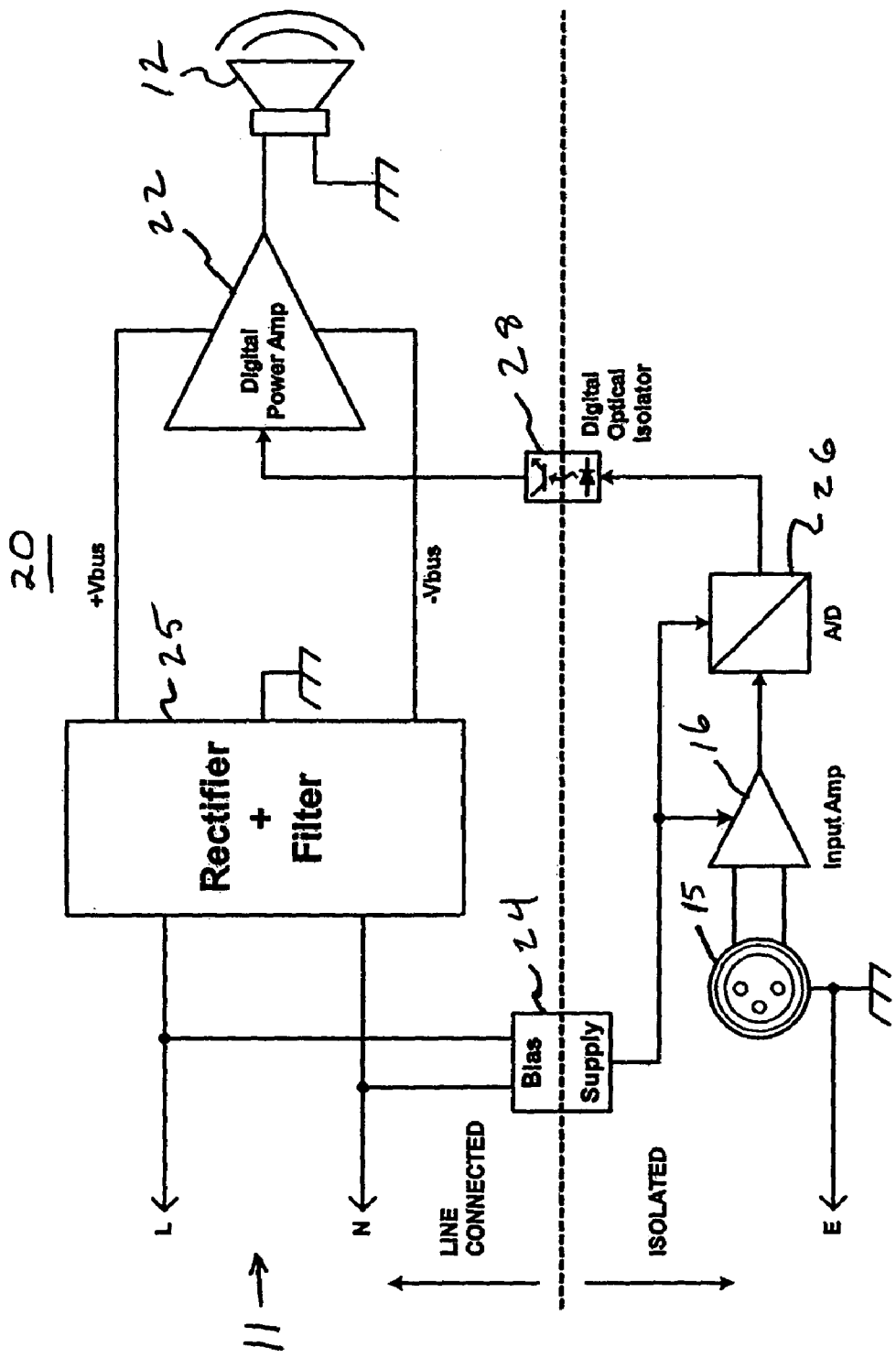
FIG. 2 is a diagram of an amplifier with an isolated audio signal input according to the present invention.

Turning now to FIG. 2, a powered or active speaker system according to the present invention is illustrated generally as system 20. In accordance with the diagram illustrating system 20, a digital power amplifier 22 drives speaker 12 based on a signal input supplied through an isolated interface. An output of amplifier 22 supplied to transducer 12 is not isolated from the line input power, however, the output of amplifier 22 is not user accessible. Because no electrical isolation need be provided to amplifier 22 in this configuration, a transformer connected to the line input power can be eliminated, thereby significantly reducing the size, weight and cost of audio amplifier system 20.

Audio input 15 must be isolated from line input power according to regulatory mandates. Accordingly, an isolated bias supply 24 provides power to audio input 15 through input amplifier 16 and analog to digital converter (ADC) 26. Bias supply 24 typically has a low power rating because the demands of input amplifier 16 and ADC 26 are very small, since they handle low level signals from audio input 15. Accordingly, even if bias supply 24 uses a transformer for isolation between audio input 15 and line input 11, such a transformer would be quite small and have significantly lower ratings than transformer 18 of conventional speaker system 13.

Audio input 15 is also isolated from line input power 11 and amplifier 22, by providing a signal isolation interface 28. Interface 28 may provide electrical isolation through optical or magnetic components, for example. As illustrated in FIG. 2, interface 28 is an optical LED-transistor coupling that transfers the output of ADC 26 to amplifier 22 without a direct electrical connection.

Amplifier 22 receives DC power from power supply 25, which consists of a rectifier and filter connected to the line input power 11. Power supply 25 is, for example, preferably a switched power supply with power factor correction and DC voltage regulation, so that power supply 25 appears as an almost purely resistive load to line input power 11, while precisely regulating DC bus power delivered to amplifier 22.

Figure 3:
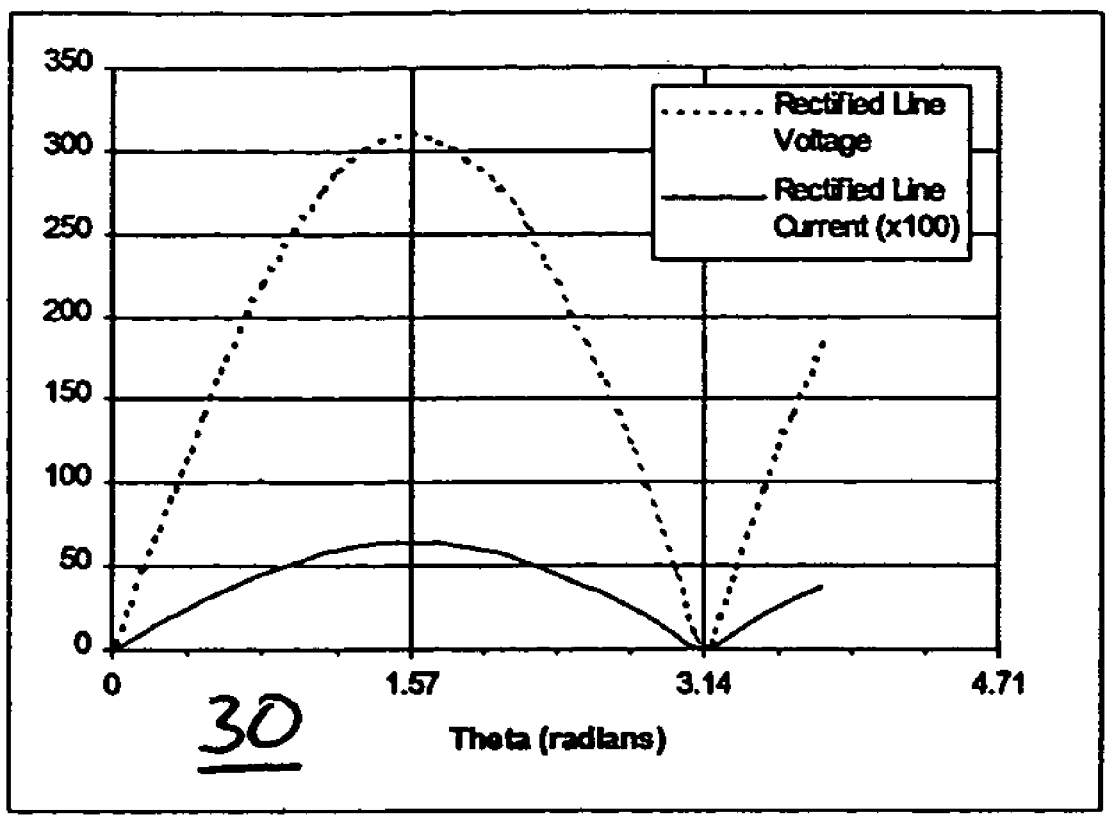
FIG. 3 is a graph illustrating power factor correction according to an embodiment of the present invention.

Referring for a moment to FIG. 3, a graph 30 illustrates a relationship between rectified input line voltage and rectified line input current over a half cycle of the line input. Graph 30 shows the rectified input line voltage in phase with the rectified input line current, indicating a high power factor close to unity, for example. As the power factor nears unity, that is, the rectified input line voltage and rectified input line current are close to being in phase with each other, power supply 25 takes on the appearance of a purely resistive load to the utility power provided at line input power 11. Accordingly, power supply 25 increases the efficiency of system 20, while reducing cost and complexity of system 20. In addition, the removal of transformer 18 permits power supply 25 to draw a sinusoidal input current that is more precisely in phase with the input voltage to obtain a high power factor, which would otherwise be difficult or impossible with the presence of transformer 18.

Another potential advantage of power supply 25 is a precisely regulated voltage bus supplied on lines +VBUS and −VBUS to amplifier 22. By precisely controlling the voltage bus supplying power to amplifier 22, a power output of amplifier 22 is more precisely and easily controlled. Accordingly, the rating requirements for amplifier 22 can be reduced while supplying a same or greater power output, thereby increasing the overall sensitivity of system 20. An increase in sensitivity of system 20 while reducing cost, weight and size is highly desirable in the field of audio production. In addition, amplifier 22 can be made to be a digital power amplifier to obtain greater fidelity in driving transducer 12. That is, input audio signal 15 is conditioned with input amplifier 16 and converted to a digital signal with ADC 26, which can be digitally manipulated to improve the quality of the audio signal delivered to amplifier 22, and consequently transducer 12. A digital signal processor (DSP) may be included in ADC 26 or amplifier 22, for example, to provide particular processing functions to improve the quality of the digital audio signal. For example, a DSP may be used to tailor the signal supplied to transducer 12 to take advantage of particular characteristics of transducer 12, either alone or in combination with amplifier 22. A DSP can also improve the quality of standard operations, such as, for example, in the case of providing a crossover function. When amplifier 22 includes a DSP, for instance, the output of amplifier 22 can be particularly manipulated to match the characteristics of transducer 12, or the combination of transducer 12 with amplifier 22, such as by digital filtering or other specifically tailored manipulation.

An important benefit of the present application is realized through the concept that the power supply need not be isolated with respect to the line input power and the output of the amplifier. This concept may be realized according to a number of circuit methodologies and topologies, with the ultimate realization goal being the removal of the power transformer connected to the line input power while achieving further functionality or efficiencies. In accordance with the present invention, rather than supplying electrical isolation at the input power interface, it is recognized that electrical isolation between the amplifier and the transducer is not required, so that a simpler and more easily realizable electrical isolation may be achieved for the audio input signal. Accordingly, other benefits and advantages through the use of the present invention may be realized with the introduction of other known techniques for power conversion and delivery including, for example, soft switching, crest factor measurement and control, transducer or amplifier feedback control, voltage bus feedback control, overvoltage protection, short circuit protection, undervoltage protection, adaptive feedback, and the like.

Accordingly, although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An amplifier system for providing an amplified signal to a load based on an input information signal, the system comprising:
a power converter for converting an input power signal to a device power signal;

an amplifier coupled to the power converter to receive the device power signal and operable to supply the amplified signal to the load based on the input information signal, wherein the amplified signal is based on an amplified input signal related to the input information and the amplified input signal is a digital signal; and an electrical isolation device coupled between the input information signal and the amplifier to provide electrical isolation between the input information signal and the input power signal.

2. The amplifier according to claim 1, further comprising an input amplifier coupled between the input information signal and the isolation device.

3. The amplifier according to claim 2, further comprising an isolated bias supply coupled between the input power signal and the input amplifier.

4. The amplifier according to claim 1, wherein the power converter provides power factor correction for the input power signal.

5. The amplifier according to claim 1, wherein the power converter further comprises a voltage bus regulator for regulating the device power signal.

6. The amplifier according to claim 1, wherein the isolation device is an optical isolator.

7. The amplifier according to claim 1, wherein the isolation device is a magnetic isolator.

8. The amplifier according to claim 1, wherein the amplifier is a digital power amplifier.

9. The amplifier according to claim 1, wherein the input information signal is an audio signal and the load is an audio transducer.

10. A method for providing electrical isolation in an amplifier for amplifying an input signal, comprising:

supplying the input signal to an isolating device coupled to an amplifier input;

converting the input signal to a digital representation; and supplying non-isolated power to the amplifier to permit the amplifier to directly drive a load based on the digital isolated input signal.

11. The method according to claim 10, further comprising providing power factor correction to an input power source supplying the non-isolated power.

12. The method according to claim 10, further comprising regulating the non-isolated power supplied to the amplifier.

13. A power amplifier system for providing an amplified output to a load based on an input signal, comprising:

a power converter directly connected to an input power line for converting input power to a device supply power;

a power amplifier coupled to the power converter for receiving the device supply power, and coupled to the input signal being operable to amplify the input signal and to provide an amplified signal to the load;

an electrical isolator between the power amplifier and the input signal for providing electrical isolation between the input signal and the amplifier; and an analog to digital converter coupled between the input signal and the isolator for converting the input signal to a digital representation supplied to the isolator, and wherein the power amplifier is a digital amplifier.

14. The amplifier system according to claim 13, wherein the power converter further comprises a power factor correction circuit and a voltage regulator, whereby the power converter contributes to improving an amplifier system power factor and regulating the device supply power.

* * * * *